United States Patent [19]

Kuhn

[11] 4,136,315

[45] Jan. 23, 1979

[54] LOW AND HIGH FREQUENCY OSCILLATORS HAVING COMMON VOLTAGE REGULATOR CIRCUIT

[75] Inventor: John J. Kuhn, Allison Park, Pa.

[73] Assignee: Westinghouse Air Brake Company, Swissvale, Pa.

[21] Appl. No.: 819,659

[22] Filed: Jul. 27, 1977

[51] Int. Cl.² .................. H03B 3/00; H03B 5/12; H03B 5/26

[52] U.S. Cl. .................. 331/46; 331/108 D; 331/110; 331/117 R; 331/142; 331/186

[58] Field of Search .............. 331/46, 56, 110, 117 R, 331/142, 186, 108 D

[56] References Cited

U.S. PATENT DOCUMENTS

| | | | |
|---|---|---|---|
| 3,793,596 | 2/1974 | Grundy | 331/110 |
| 3,794,932 | 2/1974 | Grundy | 331/110 |
| 3,813,614 | 5/1974 | Darrow | 331/186 X |
| 4,009,454 | 2/1977 | Darrow | 331/186 X |

Primary Examiner—Siegfried H. Grimm
Attorney, Agent, or Firm—J. B. Sotak; R. W. McIntire, Jr.

[57] ABSTRACT

A low frequency modulating signal and a high frequency carrier signal circuit employing a twin-T oscillator having an integrated circuit operational amplifier for producing the modulating signal and an L-C resonant feedback oscillator having a transistor amplifier for producing the carrier signal, and a monitoring shunt regulator for supplying a reference potential to the twin-T oscillator and biasing and operating potentials to the L-C resonant feedback oscillator and for deactivating the L-C resonant feedback oscillator when an increase in resistance occurs in the shunt regulator.

10 Claims, 1 Drawing Figure

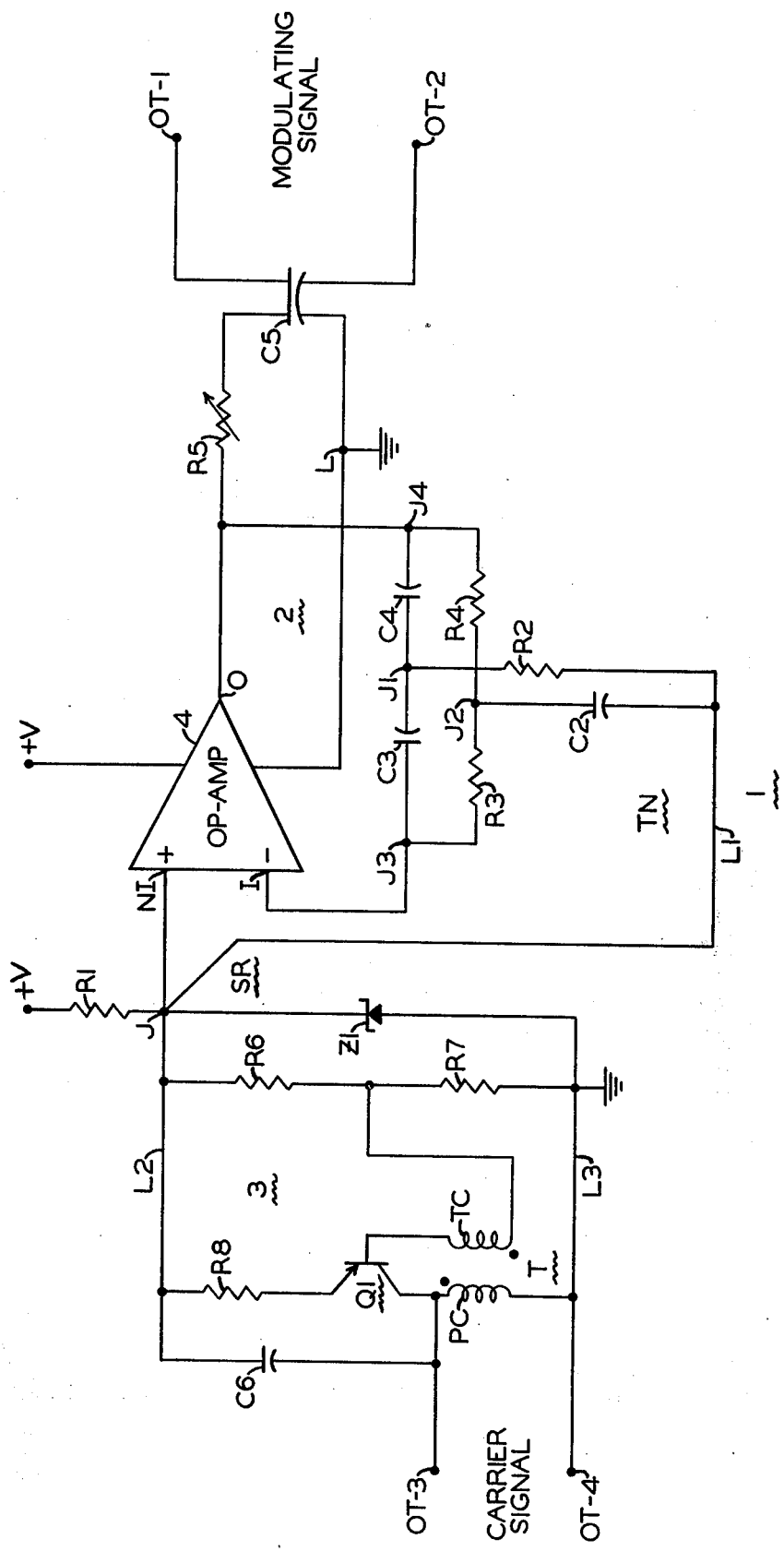

LOW AND HIGH FREQUENCY OSCILLATORS HAVING COMMON VOLTAGE REGULATOR CIRCUIT

FIELD OF THE INVENTION

This invention relates to a vital constant level coder and oscillator circuit and, more particularly, to a regulated code rate generating circuit employing an integrated circuit operational amplifier and a twin-T notch filtering network for producing a low frequency sine wave modulating signal and an oscillating circuit having an L-C resonant feedback transistor oscillator for producing an audio frequency carrier signal for use in a vital signal control system.

BACKGROUND OF THE INVENTION

In certain communication systems, such as, in an overlay coded signal control system for railroad and mass and/or rapid transit operation, the overlay control equipment provides for the transmission and reception of signal aspect information through the track rails for train operation between headblocks. In single direction traffic territory, a transmitter connected at one end of a block section sends an encoded signal to a tuned receiver connected to the other end of the block section. In two-direction traffic territory, a transmitter and a receiver are connected at each end of the block section for providing full duplex transmission of data. The present and main concern of the subject invention involves the high power audio frequency transmitters which are commonly used in the coded signal control system. In particular, the chief interest resides in the code rate generator and carrier frequency oscillator which form two essential parts or circuits of the audio frequency transmitter. In the past, the oscillator of the code rate generator was highly sensitive to noise on the d.c. supply line and to variations of the d.c. supply voltage. The former resulted in stability problems while the latter precluded the possible generation of the desired sine wave modulating signal. It was found that the use of a voltage regulating device, such as a zener diode, in communication with the code rate generator overcame the above-noted problems; however, another problem arose when any inadvertent significant increase in the resistance appeared in series with the Zener diode. For example, a cold solder joint or connection causes an increased resistance which could result in an unsafe increase of the output signal. It has been found that the deleterious effects of a high resistance connection can be eliminated by uniquely and vitally combining the code rate oscillator with the audio frequency oscillator of the audio frequency transmitter of the coded signal control system.

OBJECTS OF THE INVENTION

Accordingly, it is an object of this invention to provide a vital electronic modulating signal and carrier signal generating circuit.

Another object of this invention is to provide a vital type of constant level coder and carrier frequency oscillator.

A further object of this invention is to provide a vital type of code rate generator and an audio frequency oscillator for producing a coding signal and a carrier signal for a transmitter of a vital signal control system.

Yet another object of this invention is to provide a vital circuit employing a constant level twin-T oscillator for producing a low frequency sine wave signal and an L-C resonant feedback oscillator for producing a carrier frequency signal.

Yet a further object of this invention is to provide a regulated code rate and a carrier generating circuit for use in a transmitter of a coded signal control system.

Still another object of this invention is to provide a low and high frequency signal generating circuit comprising a low frequency oscillating circuit which includes an operational amplifier having an inverting and noninverting input and an output, a twin-T feedback network coupled between the output and one of the inverting and noninverting inputs, a voltage regulating circuit connected to the other of the inverting and noninverting inputs, a high frequency oscillating circuit includes an L-C resonant feedback transistor amplifier which is biased by voltage supplied by the voltage regulating circuit which monitors the impedance condition of the L-C resonant path.

Still a further object of this invention is to provide a vital type of code rate generating and carrier signal generating circuit which is economical in cost, simple in design, reliable in service, durable in use, reliable in operation and efficient in performance.

SUMMARY OF THE INVENTION

In accordance with the present invention, there is provided a low and high frequency generating circuit for producing a modulating signal and a carrier signal. The generating circuit employes a twin-T op-amp oscillator and an L-C resonant feedback oscillator which are coupled in common to a shunt regulator. The twin-T op-amp oscillator includes an integrated circuit operational amplifier having an inverting and noninverting input and an output. An imperfectly nulled twin-T network including a plurality of resistors and capacitors is connected between the output and the inverting input of the integrated circuit operational amplifier. An adjustable resistance and a four-terminal capacitor are connected to the output of the integrated circuit operational amplifier for developing low frequency modulating signals. The shunt regulator which includes a current-limiting resistor and a Zener diode is connected to the noninverting input of the integrated circuit operational amplifier. The L-C resonant feedback oscillator includes a PNP amplifying transistor stage. A voltage divider is coupled across the Zener diode to provide biasing and operating voltages to the transistor amplifier. A transformer includes a tickler coil to provide feedback to the transistor amplifier. A tank circuit including a transformer winding and a capacitor determine the frequency of oscillations when the Zener diode is rendered conductive and establishes a low impedance circuit path for the tank circuit whereby carrier frequency signals are developed across the transformer winding.

BRIEF DESCRIPTION OF THE DRAWINGS

Other objects, features and advantages of this invention will become more readily apparent from the following description of the preferred embodiment when read with reference to and considered in conjunction with the accompanying drawing which forms a part of this specification, in which:

The single FIGURE in the drawing is a schematic circuit diagram of a vital constant level code rate generator and carrier frequency signal oscillator in accordance with the present invention.

Referring now to the single FIGURE of the drawing, there is shown a vital type of an electronic low and high frequency signal generating circuit, generally characterized by numeral 1, which includes a code rate or modulating signal generator 2, a carrier or audio signal generator 3 and a shunt regulator SR.

As shown, the low frequency modulating signal circuit or code rate oscillator 2 includes an active gain element, such as, an integrated circuit operational amplifier (op-amp) 4. The operational amplifier 4 may be of the type manufactured and sold by Fairchild Semiconductor Corporation of Mountainview, California, and designated as MA-741. It will be noted that the operational amplifier 4 may be of the differential input signal type in that it functions on the difference of voltage of the signal levels that appear on the two inputs. As shown, one of the two inputs is termed the noninverting or positive terminal NI while the other of the two inputs is termed the inverting or negative terminal I. It will be appreciated that the noninverting input NI is biased positively by the shunt regulator SR which includes a current-limiting resistor R1 and a voltage breakdown device or Zener diode Z1. As shown, the upper end of resistor R1 is connected to the positive terminal +V of a suitable source of d.c. supply voltage (not shown) while the lower end of resistor R1 is connected to the cathode electrode of Zener diode Z1 which forms junction point J. The anode electrode of Zener diode Z1 is coupled to a suitable reference potential, such as, ground. The noninverting input NI is directly connected to the junction point J formed between resistor R1 and Zener diode Z1 which provides constant voltage over a wide range of current and voltage variations which may occur in the supply source. An appropriate terminal point of the integrated circuit op-amp 4 is connected to the positive terminal +V while another terminal point of the op-amp 4 is connected to ground via lead L. It will be noted that the output terminal O is coupled to the inverting input terminal I via a precision parallel or twin-T resistance-capacitance network TN which determines the frequency of oscillations of oscillator 2. The twin-T network TN includes resistors R2, R3, and R4 and capacitors C2, C3 and C4 which form a very sharp notch filter. In practice, the negative feedback supplied to the inverting input I from the output O through the twin-T network TN cancels the internal positive amplification of the op-amp 4 at all frequencies except the notch frequency. That is, at the preselected frequency, the feedback is regenerative so that oscillations occur at the notch frequency. As shown, resistor R2 and capacitors C3 and C4 form one tee of the network TN while capacitor C2 and resistors R3 and R4 form the other tee of the network TN. In viewing the drawing, it will be seen that the upper end of resistor R2 is connected to the junction point J1 which is common to both capacitors C3 and C4 while the lower end of resistor R2 is connected to lead L1. As shown, the upper plate of capacitor C2 is connected to junction point J2 which is common to both resistors R3 and R4 while the lower plate of capacitor C3 is connected to lead L1. The left-hand plate of capacitor C3 and the left-hand end of resistor R3 are connected together to form junction J3 which is connected to inverting input I of operational amplifier 4. Similarly, the right-hand plate of capacitor C4 and the right-hand end of resistor R4 are connected together to form junction point J4 which is connected to the output O of operational amplifier 4. Thus, a portion of the output signal developed on terminal O is fed back to the inverting input terminal I by the twin-T network TN. In the instant case, the twin-T network TN is symmetrical in that the parameters of capacitors C3 and C4 are equal and the resistors R3 and R4 have identical values. Further, in the present case, the parallel-T network TN is unbalanced from the standpoint that the resistive value of resistor R2 is not an integral value of resistors R3 or R4, and the capacitive value of capacitor C2 is not an integral value of capacitors C3 or C4. It will be appreciated that the frequency and gain of the twin-T network may be varied by changing the circuit parameters of certain selected elements. In practice, the center of notch frequency may be any one of six selected frequencies which may be from 0.800 to 7.000 hertz. The selected center frequency will undergo a 180 degree phase shift in passing from the input junction J4 to the output junction J3 of the twin-T network TN. While the twin-T network TN will pass signals of other frequencies, the network will only provide a phase shift which is less than 180 degrees and may be less than 90 degrees. At zero (0) and infinite frequencies, zero (0) phase shift takes place, while at all other frequencies, the phase angle follows a rising and decaying exponential curve toward and away from ± 90 degrees as the frequencies approach and recede from the center frequency. As shown, the output terminal O is coupled by a variable resistor or selectable resistance R5 to one of two leads of the upper plate of a four-terminal capacitor C5. One of the two leads of the lower plate is connected to lead L which is grounded. The other lead of the upper plate is connected to output terminal OT-1 while the other lead of the lower plate is connected to the output terminal OT-2. Thus, the output modulating signal developed on terminals OT-1 and OT-2 will be a sine wave having a single selected low frequency and having a substantially constant peak-to-peak value.

The transistorized carrier signal oscillator or generator 3 of the vital circuit 1 is also powered by the shunt regulator SR. As shown, the high frequency carrier generator 3 includes a single active amplifying stage consisting of PNP transistor Q1. The transistor Q1 includes a base electrode b1, a collector electrode c1 and an emitter electrode e1. A voltage dividing network including series connected resistors R6 and R7 is connected across the Zener diode Z1. It will be seen that the upper end of resistor R6 is coupled to the positive lead L2 while the lower end of resistor R7 is connected to ground lead L3. The base electrode b1 is coupled to a junction formed between voltage dividing resistors R6 and R7 via a secondary tickler coil TC of transformer T. The emitter electrode e1 is coupled to the positive lead L2 via a biasing resistor R8. The frequency of oscillations of the transistor oscillator is determined by a parallel resonant or tank circuit including the primary winding or output coil PC of transformer T and tuning capacitor C6. As shown, the primary coil PC is connected between collector electrode c1 and ground lead L3 while the capacitor C6 is connected from the collector electrode c1 to ground lead L3 via Zener diode Z1. That is, the a.c. signal path for the capacitor C6 of the tank circuit is completed via lead L2 through the low impedance of the conducting Zener diode Z1 to the ground lead L3. Thus, the carrier signal is incapable of being developed on output terminals OT-3 and OT-4 unless the upper plate of capacitor C6 is connected to ground lead L3 through a low impedance path completed by the conduction of the Zener diode to form the tuned parallel resonant circuit which is necessary for establishing the oscillating condition of the transistor oscillator 3. Thus, the impedance condition of the resonant circuit path is checked and monitored to ensure that if the voltage on junction point J increases due to a poor solder connection, the carrier signal oscillator 3 will cease producing oscillations so that a circuit failure is inherently and readily ascertainable. That is, the increased impedance caused by the poor solder joint results in a decrease in the quality Q of the tuned resonant circuit so that the gain of the loop decreases and causes cessation of the carrier signal oscillations. Thus, the vitality of the code rate generator and carrier frequency oscillator circuit 1 is maintained to ensure that an unsafe condition does not occur during such a critical circuit or component failure.

In describing the operation, let us assume that the biasing and supply voltages are applied, that all the components or elements are intact and that circuit 1 is functioning properly. Under this condition, it will be seen that both the low frequency oscillator 2 and the high frequency oscillator 3 go into oscillation so that a low frequency modulating signal is developed on output terminals OT-1 and OT-2 and a high frequency carrier signal is developed on terminals OT-3 and OT-4. The modulating output signals take the form of sine waves having a constant peak-to-peak value and are appropriately fed to the modulator circuit or portion of the transmitter of the coded signal control system. The carrier output signals may have, for example, one of four audio frequencies, such as, 270, 330, 380 or 450 hertz, and are fed to the modulator so that a constant amplitude modulated signal is transmitted to the coded track section. As previously mentioned, a potentially hazardous condition may result when a high resistance appears in series with the Zener diode Z1 since the voltage level applied to the noninverting input would increase and would cause an increase in the peak-to-peak amplitude of the sine wave modulating signals developed on output terminals OT-1 and OT-2. However, with the Zener diode placed in the return path for the capacitor C6 of the tank circuit of the carrier frequency signal oscillator 3, the appearance of a high resistance in series with the Zener diode Z1 will result in the cessation of the oscillations on the output terminals OT-3 and OT-4 which will result in a safe condition since the modulating signals have no carrier wave. Thus, the vitality of the coded signal control system is maintained by the code rate generating and carrier frequency oscillating circuit 1.

It will be appreciated that the vitality of the coded signal control system is maintained since the circuit 1 will under no circumstance cause the transmitter to produce an unsafe condition, namely, a greater than normal output modulated waveform.

It will be understood that while the invention finds particular utility in an overlay coded signal control system, it is readily evident that the low and high frequency generating circuit 1 may be employed in various other systems and apparatus which require the inherent vitality of this invention but regardless of how or where the invention is used, it will be appreciated that various changes may be made by persons skilled in the art without departing from the spirit and scope of the invention. It will also be apparent that other alterations, ramifications and modifications can be made in the presently described invention, and therefore, it is understood that all changes, equivalents and deviations within the spirit and scope of this invention are herein meant to be included in the appended claims.

Having thus described the invention, what I claim as new and desire to secure by Letters Patent, is:

1. A low and high frequency signal generating circuit comprising, a low frequency oscillating circuit including an operational amplifier having an inverting and noninverting input and an output, a twin-T feedback network coupled between the output and one of the inverting and noninverting inputs, a voltage regulating circuit connected to the other of the inverting and noninverting inputs, and a high frequency oscillating circuit including a resonant feedback transistor amplifier being biased by voltage supplied by said voltage regulating circuit.

2. The low and high frequency signal generating circuit as defined in claim 1, wherein said twin-T network includes a plurality of resistors and capacitors which are imperfectly nulled to a predetermined frequency.

3. The low and high frequency signal generating circuit as defined in claim 1, wherein said voltage regulating circuit includes a current-limiting resistor and voltage breakdown device.

4. The low and high frequency signal generating circuit as defined in claim 3, wherein said voltage breakdown device is a Zener diode.

5. The low and high frequency signal generating circuit as defined in claim 1, wherein the output of said operational amplifier includes a variable resistor and a four-terminal capacitor.

6. The low and high frequency signal generating circuit as defined in claim 1, wherein said high frequency oscillating circuit is tuned to the resonant frequency by an L-C circuit.

7. The low and high frequency signal generating circuit as defined in claim 1, wherein said high frequency oscillating circuit includes a tickler coil for providing regenerating feedback signals to said transistor amplifier.

8. The low and high frequency signal generating circuit as defined in claim 6, wherein the inductor and capacitor of said L-C circuit are coupled as a tank circuit when said voltage regulating circuit is conductive and establishes a low impedance path for said tank circuit.

9. The low and high frequency signal generating circuit as defined in claim 1, wherein said transistor amplifier includes a PNP transistor.

10. The low and high frequency signal generating circuit as defined in claim 1, wherein said high frequency oscillating circuit includes an L-C resonant PNP transistor amplifier.

* * * * *